United States Patent [19]

Hatakeyama et al.

[11] Patent Number: 5,253,204
[45] Date of Patent: Oct. 12, 1993

[54] SEMICONDUCTOR MEMORY DEVICE HAVING A BOOST CIRCUIT

[75] Inventors: Atsushi Hatakeyama; Masao Nakano, both of Kawasaki, Japan

[73] Assignee: Hatakeyama et al., Kanagawa, Japan

[21] Appl. No.: 747,049

[22] Filed: Aug. 19, 1991

[30] Foreign Application Priority Data

Aug. 20, 1990 [JP] Japan ................. 2-218731

[51] Int. Cl.⁵ .......................................... G11C 11/407
[52] U.S. Cl. .......................... 365/189.06; 365/230.06
[58] Field of Search ................. 365/189.06, 230.06, 365/189.11, 203

[56] References Cited

U.S. PATENT DOCUMENTS 4,807,190  2/1989  Ishii et al. ................. 365/203 X
5,051,959  9/1991  Nakano et al. ............. 365/230.06

FOREIGN PATENT DOCUMENTS 0367450  5/1990  European Pat. Off. .
62-197997  9/1987  Japan .

OTHER PUBLICATIONS

IEEE Journal of Solid-State Circuits, vol. 16, No. 5, Oct. 1981 pp. 492–498, Taniguchi et al. "Fully Boosted 64K Dynamic Ram with Automatic and Self Refresh".
Patent Abstracts of Japan, vol. 7, No. 152, Jul. 5, 1983, JP-A 58-62895.

Primary Examiner—Joseph A. Popek
Attorney, Agent, or Firm—Armstrong, Westerman, Hattori, McLeland & Naughton

[57] ABSTRACT

A semiconductor memory device comprises a memory cell array including a plurality of memory cells, a word line selection circuit for selecting a word line, a bit line selection circuit for selecting a bit line, an input/output circuit for supplying data to be written to a selected memory cell via the selected bit line and for reading data from the selected memory cell via the selected bit line, a word line driver including a MOS transistor having a drain supplied with a supply voltage and a source connected to the word line selection circuit for supplying a word line voltage to the selected word line via the word line selection circuit, a word line boosting circuit connected to the drain of the MOS transistor for boosting the word line voltage via the MOS transistor, a boosting capacitor connected across the source and the gate of the MOS transistor, and a clamping circuit connected to the gate of said MOS transistor for clamping the voltage level at a predetermined level.

12 Claims, 9 Drawing Sheets

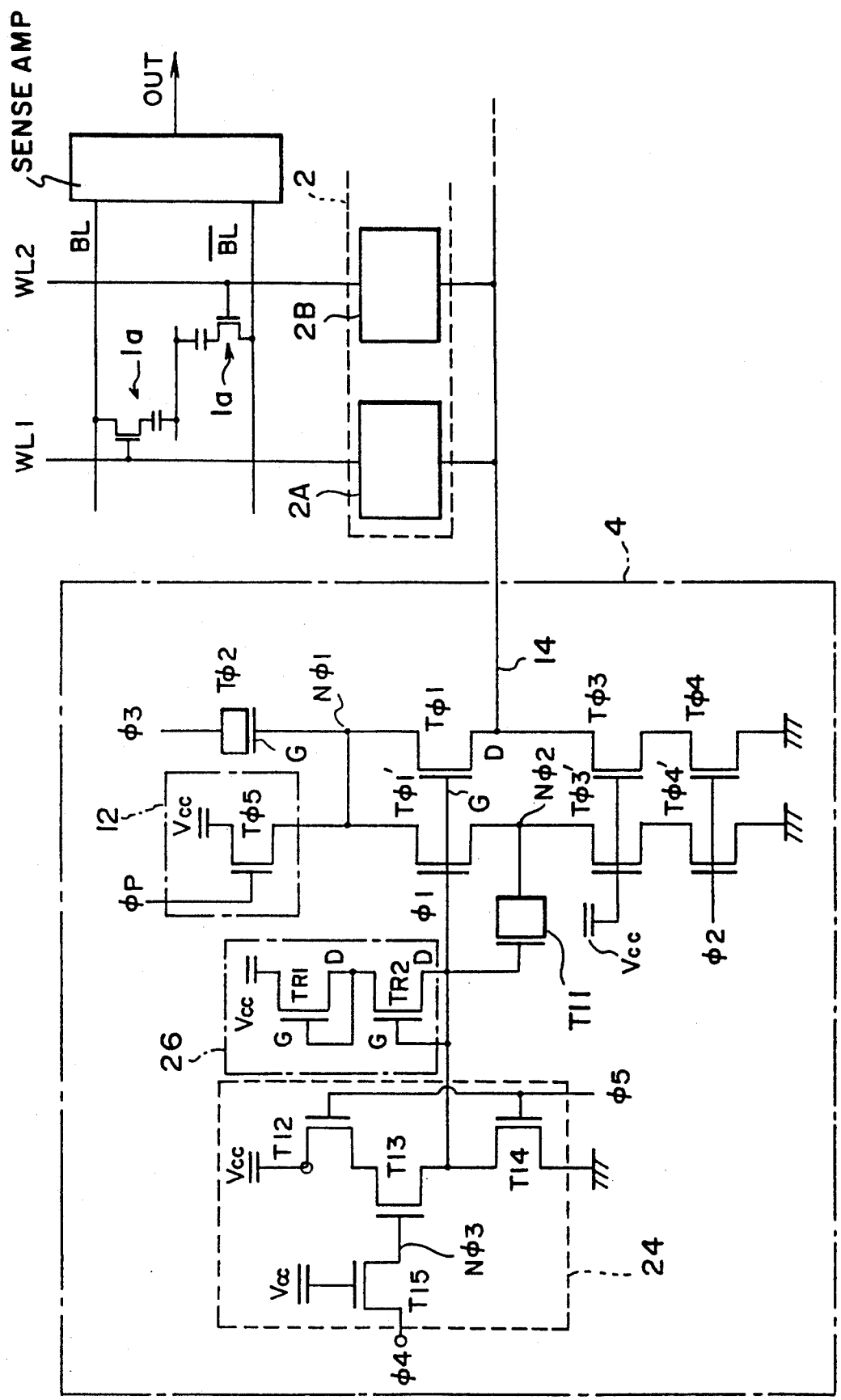

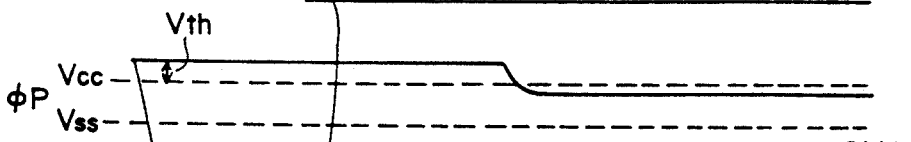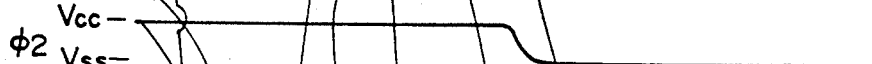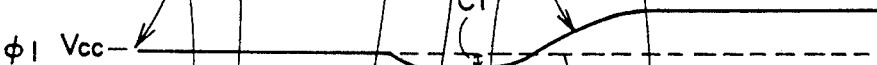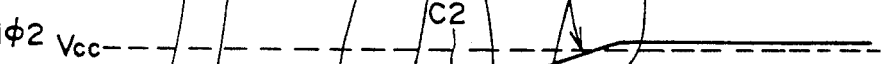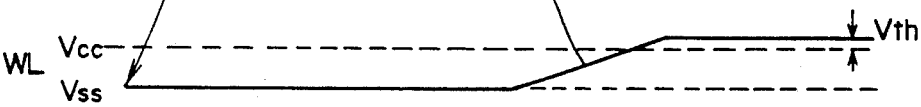

SEMICONDUCTOR MEMORY DEVICE HAVING A BOOST CIRCUIT

The present invention generally relates to semiconductor memory devices and, more particularly, to a semiconductor memory device having a boost circuit.

With the recent progress in the fine lithographic patterning, semiconductor devices having extremely fine device patterns are produced. In the logic devices, such a miniaturization improves the operational speed. In the memory devices, one can achieve an increase in the memory capacity as a result of the miniaturization. In such miniaturized semiconductor devices, however, there is a tendency for the operational characteristics of the semiconductor devices to be degraded after use for a long time.

In the semiconductor memory devices, reading and writing of data is achieved by addressing a memory cell that in turn is made by selecting a word line and a bit line. At the time of reading, a word line voltage which is boosted to a level above the supply voltage level is applied to a selected word line to activate the memory cell transistor that is connected to a selected memory cell, and the voltage change appeared on the selected bit line is detected. At the time of writing data into the selected memory cell, too, the selected word line is boosted and the data on the selected bit line is written into the memory cell.

FIG. 1 shows an overall construction of a typical dynamic random access memory (DRAM) device.

Referring to FIG. 1, the device comprises a memory cell array 1 in which a number of memory cells 1a are arranged in rows and columns, wherein the memory cells aligned in the row direction are connected commonly to a word line WL while the memory cells aligned in the column direction are connected commonly to a bit line BL.

The word lines are connected to the word decoder 2 and selectively enabled by a row decoder 2 in response to address data ADDRESS that is supplied to an address buffer circuit 3. Thereby, a word line voltage produced by a word line driver 4 is supplied to the selected word line WL via the row decoder 2. The address buffer circuit 3 further produces column address data for specifying a bit line, and the column address data thus produced is supplied to a column decoder 5. There, the column decoder 5 selects the specified bit line BL via an input/output gate 6.

When reading data, the memory cell transistor is activated for all the memory cells that are connected commonly to a selected word line WL, and a minute voltage change appears in each bit line of the memory cell array 1 according to the content of data that is stored in the memory cell. This voltage change thus appearing on each bit line is detected by a sense amplifier that is included in the input/output gate 6, and the column decoder 5 selectively outputs the voltage change of the selected bit line BL as the output data Dout. The output data is then transferred to an output terminal Dout via an output buffer circuit 7.

When writing data, the word line WL is selected similarly to the case of reading. Further, a write enable signal /WE is supplied to an input buffer circuit 8 via a write clock generator 9 to activate the same. Further, input data Din is supplied to the input buffer circuit 8 thus activated. Thereby, the input data Din is transferred from the buffer circuit 8 to the column decoder 5 and further to a selected bit line BL, and is written into the selected memory cell 1a via the memory cell transistor that is activated by the selection of the word line WL.

The foregoing read/write operation is activated in response to the row address strobe signal /RAS and the column address strobe signal /CAS as usual in the DRAM device. There, the strobe signals /RAS and /CAS are supplied to a clock generator 9 that produces and supplies various control signals to the row decoder 2, address buffer 3, the word line driver 4, the column decoder 5, the input/output gate 6, the output buffer circuit 7, and the input buffer circuit 8.

In order to accelerate the speed of the read/write operation, a common practice is to increase the word line voltage of the selected word line WL to a level exceeding the supply voltage Vcc. For this purpose, the conventional DRAM device uses a boost circuit in cooperation with the word line driver 4.

FIG. 2 shows an example of the conventional word line driver 4 in which a boost circuit 20 is used.

Referring to FIG. 2, the word line driver 4 includes MOS transistors T01, T03 and T04 connected in series, wherein the drain of the MOS transistor T01 is connected to a capacitance that is provided by a MOS transistor T02, at a node N01. More specifically, the drain of the MOS transistor T01 is connected to the gate of the MOS transistor T02 that in turn has its source and drain connected with each other and functions as the capacitor. As will be described later, this transistor T02 acts as the boost circuit for boosting the word line voltage.

The source of the MOS transistor T01 is connected to the drain of the MOS transistor T03, and the source of the MOS transistor T03 is connected to the drain of the MOS transistor T04. Further, the source of the transistor T04 is connected to the ground. Thereby, a main word line 14 is connected to the source of the MOS transistor T01. The main word line 18, in turn, is connected to the row decoder 2 of FIG. 1 that includes a number of drive circuits 2A, 2B, . . . . Each of the drive circuits 2A, 2B, . . . is connected to a corresponding word line WL1, WL2, . . . and activates the same selectively in response to the address data supplied thereto from the address buffer circuit 3.

A similar path of current is provided by MOS transistors T01', T03' and T04' that are connected with each other between the node N01 and the ground. Thus, the drain of the transistor T01' is connected to the node N01, the source of the transistor T01' is connected to the drain of the transistor T03', the source of the transistor T03' is connected to the drain of the transistor T04', and the source of the transistor T04' is connected to the ground.

As shown in FIG. 2, the gate of the transistor T01 and the gate of the transistor T01' are connected commonly to an input terminal to which a control signal $\phi 1$ is supplied from the clock generator 10 of FIG. 1. The gate of the transistor T03 and the gate of the transistor T03' are connected commonly with each other to the power supply terminal for receiving the supply voltage Vcc. Further, the gate of the transistor T04 and the gate of the transistor T04' are connected with each other to an input terminal to which a second control signal $\phi 2$ is supplied from the clock generator 10. Furthermore, the source and drain of the transistor T02 that are connected commonly with each other as already described, are connected to another input terminal to which a third control signal $\phi3$ is supplied from the clock generator 10. Further, a capacitance provided by a MOS transistor T11 is connected between the gate and the source of the MOS transistor T01'.

The circuit of FIG. 2 is driven by a drive voltage that is supplied to the node N01, and for this purpose, a precharge circuit 12 is provided. Thus, the precharge circuit is supplied with the supply voltage Vcc and supplies the same to the node N01.

In operation, the level of the control signals $\phi1$ and $\phi3$ are set at zero while the level of the signal $\phi2$ is set at Vcc at the beginning of operation. See FIG. 3. In this state, the supply voltage Vcc appears at the node N01 and the electric charges are accumulated in the capacitance that is provided by the MOS transistor T02. Further, the electric charges are accumulated in the capacitor T01 during this interval.

In response to the /RAS signal, the level of the control signal $\phi1$ is increased as shown in FIG. 3. With the increase in the level of the signal $\phi1$, the transistor T01 starts to conduct while the transistor T04 starts to cause transition to the unconductive state. Thereby, the voltage level of the node N01 decreases momentarily until the transistor T04 turns off completely. As a result of the transition of the transistor T01 to the turned-on state and the transition of the transistor T04 to the turned-off state, a word line voltage starts to appear on the main word line 14, as shown in FIG. 3.

Next, the control signal $\phi3$ is activated such that the level of the signal $\phi3$ increases from zero to the Vcc level. In response to this, the electric charges that have been accumulated in the capacitor T02 are transferred to the node N01, and the voltage level of the node N01 is boosted as shown in FIG. 3. In response to this, the word line voltage appearing at the main word line 14 is boosted. Thus, the capacitor T02 functions as the boost circuit for boosting the word line, as described previously.

Simultaneously to the boosting of the node N01, the gate voltage of the transistors T01 and T01' is also boosted by the capacitor T11. It should be noted that the increase in the voltage at the node N01 induces a corresponding increase in the source voltage of the transistor T01', and this increase in the source voltage causes a boosting of the gate voltage of the transistors T01 and T01' via the capacitor T11. Thereby, the conductive state of the transistor T01 is maintained even when the voltage level at the node N01 is boosted.

In order to prevent the excessive boosting of the main word line 14, the conventional word line driver 4 uses a clamp circuit 20 in connection with the main word line 14. It should be noted that the memory cell transistors generally have an extremely thin gate oxide film as a result of miniaturization which is degraded quickly when excessive word line voltage is applied repeatedly to the gate. As shown in FIG. 2, the clamp circuit 20 includes a MOS transistor 22 having its drain and gate connected with each other, and the supply voltage Vcc is supplied to the source of the transistor 22. There, the transistor 22 conducts when the level of the main word line 14 exceeds a level Vcc +Vth, wherein Vth represents the threshold voltage of the transistor 22. Thus, the word line voltage on the main word line 14 decreases to the level Vcc+Vth after a bump 24 as shown in FIG. 3, and the excessive increase in the word line voltage is avoided.

In such a conventional word line driver circuit 4, there is a problem in that the capability of the clamp circuit 20 for removing the electric charges is not sufficient, as the clamp circuit 20 is connected to the word line 14 that extends for an excessive length in the semiconductor memory device and thus has a considerable capacitance. Once the word line 14 has started boosting, the conventional clamp circuit 20 cannot prevent the word line from being excessively boosted because of the limitation in the capability of the transistor 22 for removing the electric charges from the word line. Thus, there is a tendency that the voltage bump or overshoot occurs at the time of boosting the word line voltage, even when the clamp circuit 20 is used. When such a voltage overshoot is not eliminated, the memory cell transistors experience an adverse effect and the lifetime of the semiconductor memory device is decreased.

SUMMARY OF THE INVENTION

Accordingly, it is a general object of the present invention to provide a novel and useful semiconductor memory device, wherein the foregoing problems are eliminated.

Another and more specific object of the present invention is to provide a semiconductor memory device having a boost circuit in a word line driver for boosting a word line voltage, wherein the excessive boosting of the word line voltage is eliminated.

Another object of the present invention is to provide a semiconductor memory device having a boost circuit in a word line driver for boosting a word line, with a clamp circuit provided for preventing excessive boosting of the word line voltage, wherein the voltage overshoot in the word line voltage is eliminated.

Another object of the present invention is to provide a semiconductor memory device having a boost circuit for boosting a word line and a clamp circuit cooperating with the word line, wherein the clamp circuit is connected to a gate of a MOS transistor that forms a part of a word line driver and activates the word line in cooperation with the boost circuit, such that the clamp circuit clamps the gate voltage of the MOS transistor at a predetermined level even when the boost circuit is activated. According to the present invention, the excessive rising of the word line voltage on the word line is positively prevented while using a transistor that provides a modest drive current for the clamp circuit, and the lifetime of the semiconductor memory device is improved.

Other objects an further features of the present invention will become apparent from the following detailed description when read in conjunction with the attached drawings.

BRIEF DESCRIPTION OF THE DRAWINGS

FIG. 6 is a circuit diagram showing a first embodiment of the present invention;

FIGS. 7(A)–7(K) are diagrams showing the operation of the circuit of FIG. 6;

DETAILED DESCRIPTION

Figure 4:
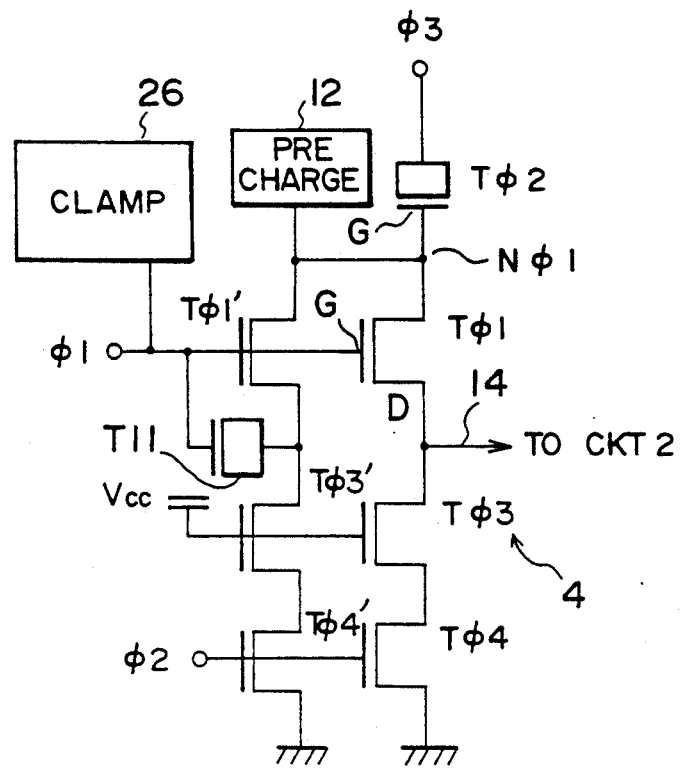
FIG. 4 is a circuit diagram showing the principle of the present invention.

FIG. 4 shows the principle of the present invention. In FIG. 4, the parts that correspond to those described previously are identified with the same reference numerals and the description thereof will be omitted.

Figure 2:
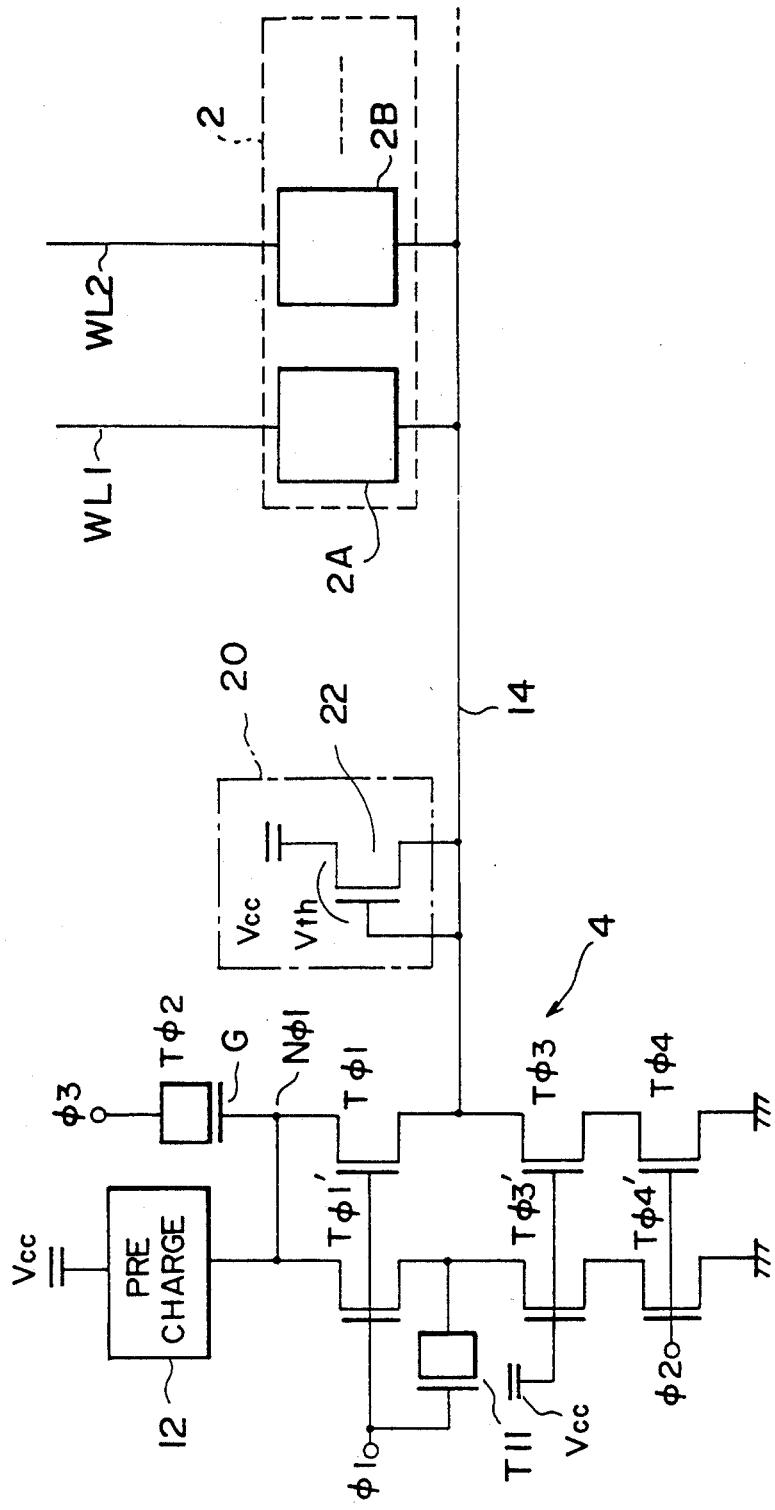
FIG. 2 is a circuit diagram showing a word line driver of the semiconductor memory device of FIG. 1.

Referring to FIG. 4, the word line driver 4 has the construction substantially identical with the conventional word line driver of FIG. 2, including the boost circuit formed of the MOS transistors T02 and T11. In the present invention, however, the clamp circuit 26 is not connected to the main word line 14 but to the gate of the transistors T01 and T01'. Thereby, the circuit 26 clamps the voltage $\phi 1$ at the gate of the transistors T01 and T01' at a clamping level of $V+2Vth$ when the voltage $\phi 1$ exceeds the foregoing clamping level. The level Vth herein represents the threshold voltage of the transistors T01 and T01'.

Figure 5:
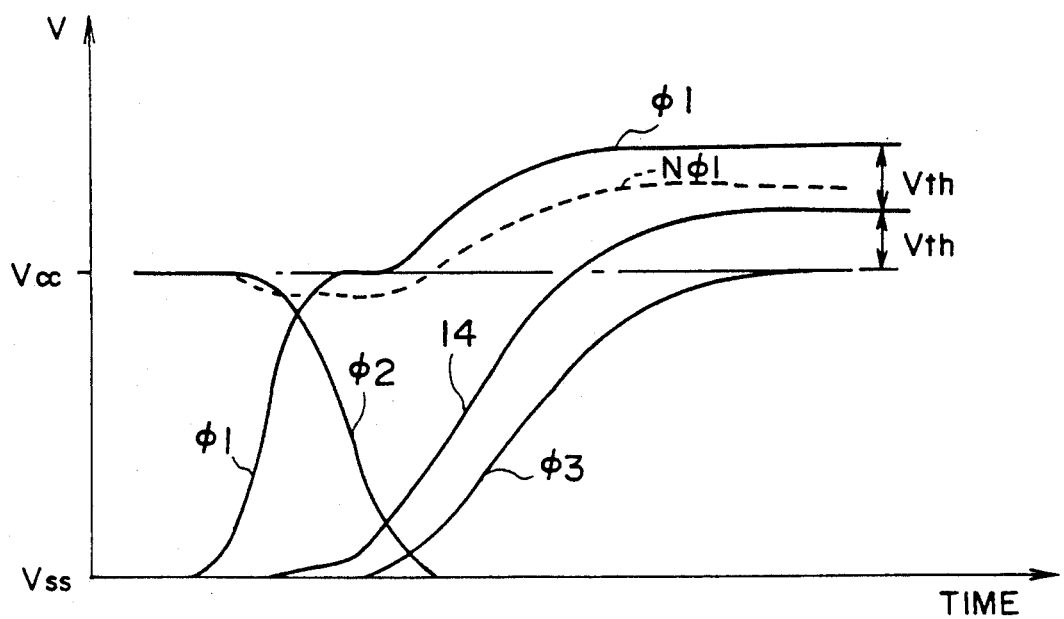
FIG. 5 is a diagram showing the operation of the circuit of FIG. 4.

FIG. 5 shows the operation of the circuit of FIG. 4.

Figure 3:
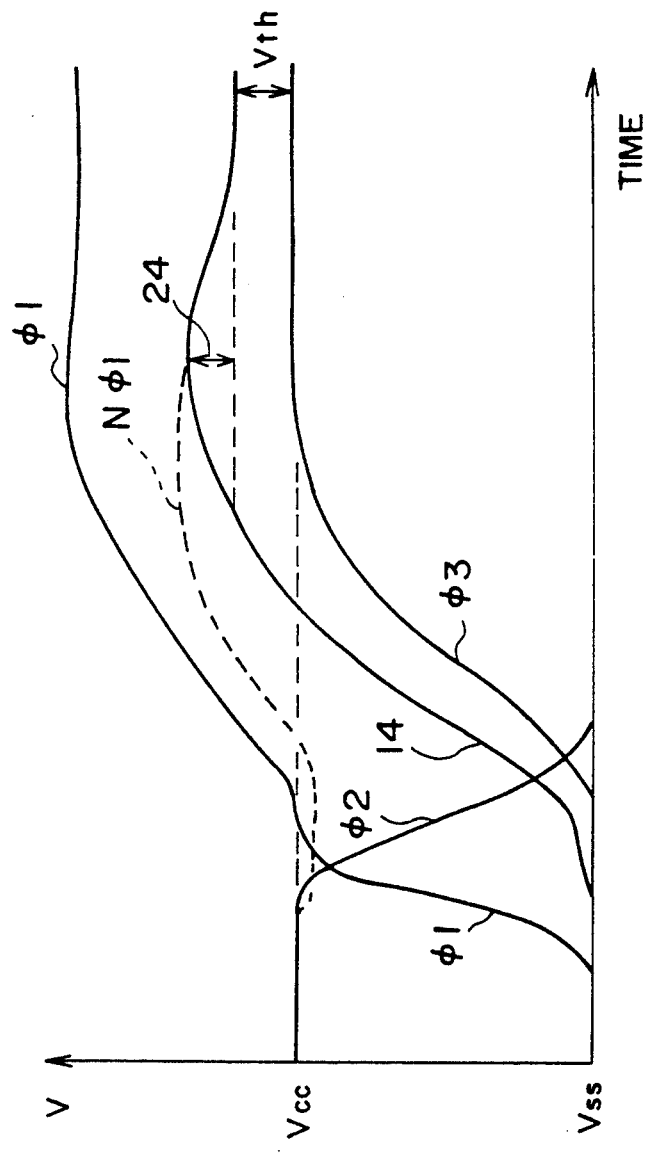
FIG. 3 is a diagram showing the operation of the circuit of FIG. 2.

Referring to FIG. 5, the control signal $\phi 1$ rises similar to FIG. 3 to the Vcc level at first, and is boosted further in response to the rising of the control signal $\phi 3$ to the Vcc level. Thereby, the level of the signal $\phi 1$ is clamped at the level $Vcc+2Vth$, and a voltage drop of Vth appears across the gate and the drain of the transistor T01. Thereby, the word line voltage at the main word line 14 is clamped at the level of $Vcc+Vth$. With this construction, one can effectively eliminate the voltage overshoot at the time of boosting the word line voltage because of the reduced capacitance connected to the gate of the transistor T01 and T01'. It should be noted that the capacitance at the gate of the transistors T01 and T01' is substantially smaller than the capacitance associated with the word line 14, and the clamp circuit 26 can effectively remove the electric charges when the word line voltage is excessively boosted.

FIG. 6 shows a first embodiment of the present invention. In FIG. 6, the parts that have been described previously are identified by the same reference numerals and the description will be omitted.

Referring to FIG. 6, the word line driver circuit 4 includes a circuit 24 for producing the control signal $\phi 1$. The circuit 24 includes an n-channel MOS transistor T15 having a source to which an input control signal $\phi 4$ is supplied from the clock generator 10. The transistor T15 has a gate connected to the supply voltage source for receiving the supply voltage Vcc and a drain connected to the gate of a p-channel MOS transistor T13. The MOS transistor T13 in turn is connected in series to a p-channel MOS transistor T12 and an n-channel MOS transistor T14, wherein the drain of the transistor T13 is connected to the drain of the transistor T12, the source of the transistor T13 is connected to the drain of the transistor T14, and the source of the transistor T12 is connected to the power supply terminal Vcc. The source of the transistor T14 is connected to the ground. Further, the gate of the transistor T12 and the gate of the transistor T14 are connected commonly with each other and receives another control signal $\phi 5$ from the clock generator 10 of FIG. 1. The control signal $\phi 1$ is obtained at the source of the transistor T13. Thus, in the present embodiment, the control signal $\phi 1$ is produced by the circuit 24 based upon the control signals $\phi 4$ and $\phi 5$ rather than given directly from the clock generator 10.

In the present embodiment, the clamp circuit 26 includes two MOS transistors TR1 and TR2 connected in series and both having the threshold level of Vth, wherein the gate and drain are connected each other in each of the transistors TR1 and TR2, and the transistor TR1 has its source connected to the power supply terminal Vcc. The gate and drain of the transistor TR2 are connected to the gate of the transistors T01 and T01'. Further, the precharge circuit 12 includes a MOS transistor T05 having its drain connected to the power supply terminal Vcc and the source connected to the node N01. The transistor T05 is supplied with a precharge control signal $\phi P$ at the gate and is activated in response thereto.

FIGS. 7(A)–7(K) explains the operation of the circuit of FIG. 6.

At the beginning of operation, it is assumed that the signal /RAS is set to have the high level state as shown in FIG. 7(A), the precharge control signal $\phi P$ is set to have the level $Vcc+Vth$ as shown in FIG. 7(B), the control signal $\phi 4$ is set to have the high level state as shown in FIG. 7(F), and the control signal $\phi 5$ is set to have the high level state as shown in FIG. 7(G). Further, the level of the control signal $\phi 2$ is held high as shown in FIG. 7(D) and the level of the control signal $\phi 3$ is held low as shown in FIG. 7(E).

In response to the high level state of the signal $\phi 5$, the transistor T14 is turned on and the transistor T12 is turned off. Thereby, the level of the control signal $\phi 1$ is held low as shown in FIG. 7(C). With the low level state of the signal $\phi 1$, the level at a node N02 corresponding to the drain of the transistor T1' is held low as shown in FIG. 7(I). On the other hand, the level of a node N03 corresponding to the gate of the transistor T13 is held at the high level state as shown in FIG. 7(J), in response to the high level state of the control signal $\phi 4$. In this initial state, the level of the word line 14 is held low as shown in FIG. 7(K).

The read (or write) operation is started in response to the transition of the /RAS signal as shown in FIG. 7(A). In response to this, the control signal $\phi 5$ causes a transition to the low level state as shown in FIG. 7(G), and the transistor T14 changes its state from the conductive state to the unconductive state. Further, the transistor T12 causes a transition to the conductive state. Thereby, the level of the source of the transistor T13 is increased in response to the high level state of the node N03, and the level of the control signal $\phi 1$ starts to rise as shown in FIG. 7(C) to the level Vcc. This increase in the level of the control signal $\phi 1$ in turn causes a boost of the gate voltage of the transistor T13 due to the capacitance of the transistor T13. See FIG. 7(J). After a predetermined interval, however, the control signal $\phi 4$ causes a transition to the low level state as shown in FIG. 7(F), and in response thereto, the voltage level of the node N03 decreases as shown in FIG. 7(J). Thereby, the transistor T13 is turned off and the gate of the transistor T01 becomes floating due to the turning off of both transistors T13 and T14.

Next, the level of the control signal $\phi 3$ is changed to the high level state as shown in FIG. 7(E), after a momentary voltage drop c1. This momentary voltage drop is caused by the conduction of the transistor T01 in response to the high level state of the control signal $\phi 1$. Thereby, a corresponding voltage rise c2 appears at the node N02 in correspondence to the voltage drop c1 as shown in FIG. 7(I).

In response to the rising of the voltage level of the control signal $\phi3$, the voltage level at the node N01 is boosted as shown in FIG. 7(H), and in response to this, the level of the node N02 is also boosted as shown in FIG. 7(I). Further, the boost of the node N01 causes a boost of the word line voltage on the word line 14 as shown in FIG. 7(K). The boost of the node N02 in turn causes the boost of the control signal $\phi1$ at the gate of the transistor T01 as shown in FIG. 7(C). This boost is, however, clamped at the level Vcc+2Vth by the clamp circuit 26, and the boost of the voltage level of the word line 14 is clamped at the level of Vcc+Vth as shown in FIG. 7(K). It should be noted that the transistors TR1 and TR2 cause a flow of electric charges from the gate of the transistors T01 and T01' to the power supply terminal Vcc whenever the voltage level $\phi1$ exceeds the level Vcc+2Vth. The precharge control signal $\phi P$ is disabled after the boosting of the word line is started.

In the present invention, the adverse influence of the large capacitance of the word line 14 on the efficiency of removal of electric charges by the clamp circuit 26 is minimized by connecting the clamp circuit at the gate of the transistors T01 and T01'. This in turn enables use of a transistor of modest capability for flowing the drive current for the transistors TR1 and TR2 of the clamp circuit 26, and one can obtain a quick response of the clamp circuit 26. Thereby, the problem of voltage overshoot of the word line can be eliminated entirely, and one can extend the lifetime of the semiconductor memory device. This in turn results in the improvement in the reliability of systems that employ the semiconductor memory device.

In the present embodiment, it should be noted that the electric stress applied to the gate oxide film of the transistors T01 and T01' is limited to the level 2Vth, even when the boosting is applied and the gate voltage is increased to the level Vcc+2Vth. On the other hand, the word line voltage of Vcc+Vth is directly applied to the gate oxide of the memory cell transistor as the electric stress. Thus, it will be understood that the clamping of the word line voltage at the level Vcc+Vth is essential for the long lifetime of the memory cell transistors, while the boosting of the gate of the transistors T01 and T01' to the level Vcc+2Vth causes little adverse effect on these transistors.

It should be noted that one can eliminate the transistors T01', T03' and T04' in FIG. 6. In this case, the capacitance given by the MOS transistor T11 is provided by the capacitance between the drain and the gate of the MOS transistor T01.

Figure 8:
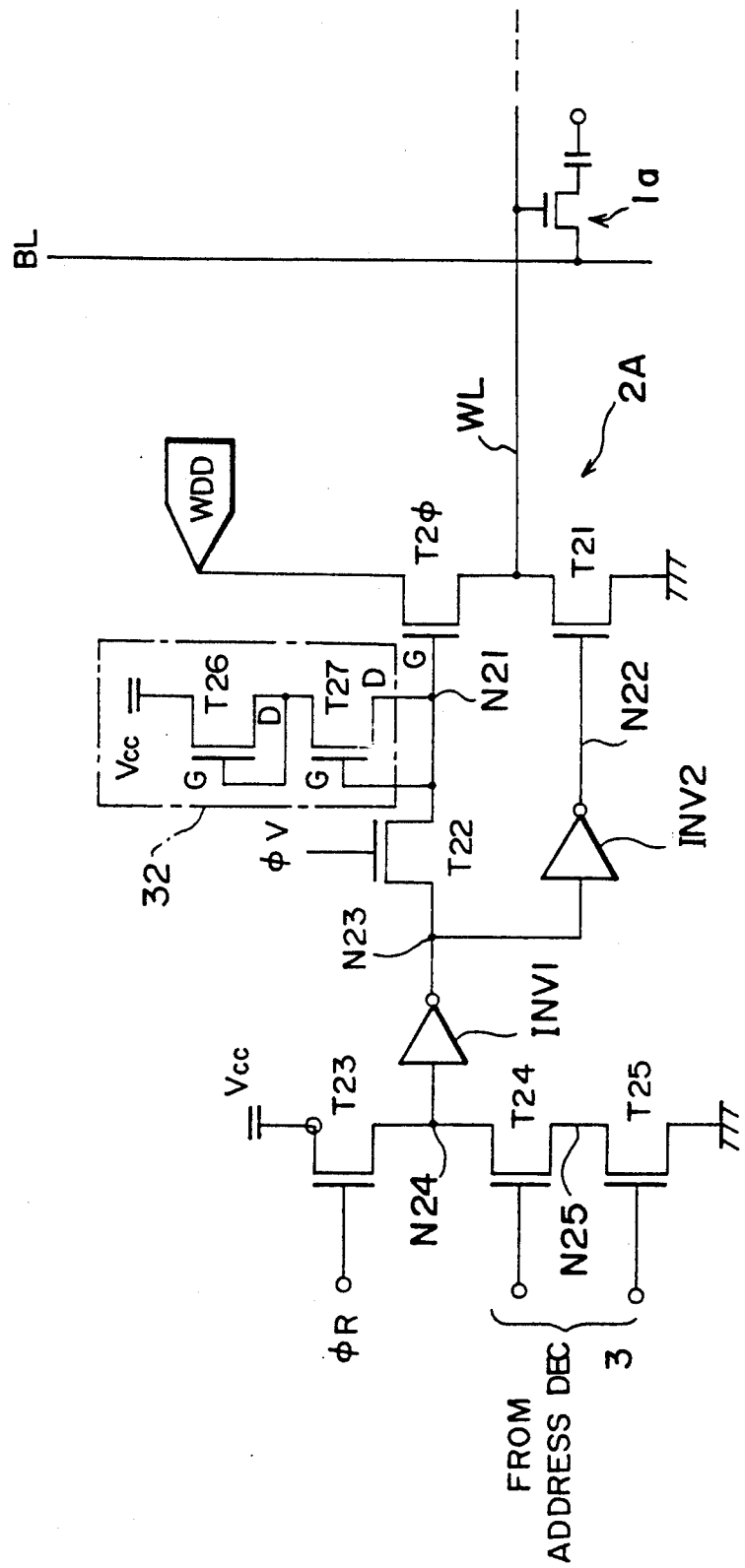
FIG. 8 is a circuit diagram showing a second embodiment of the present invention.

FIG. 8 shows a second embodiment of the present invention, wherein a single MOS transistor is used for activating the word line.

Figure 1:
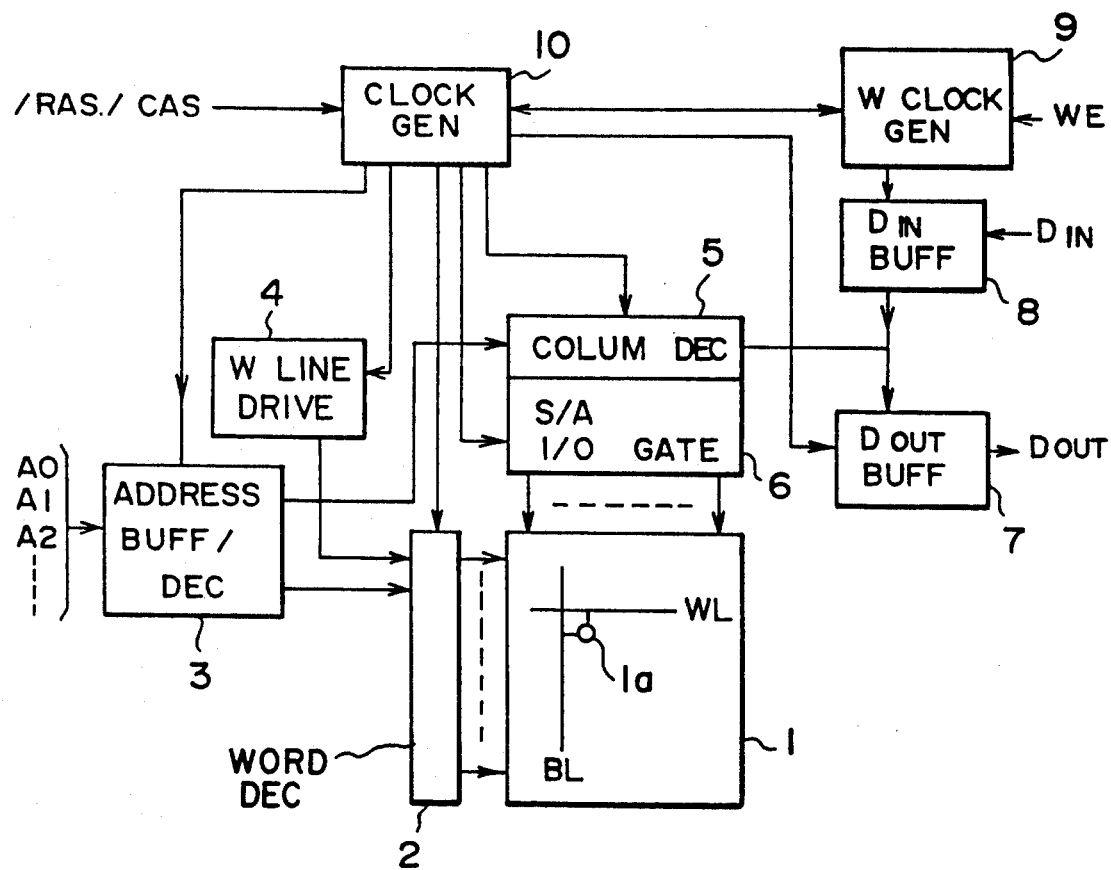
FIG. 1 is a block diagram showing the overall construction of a conventional semiconductor memory device.

Referring to FIG. 8 showing a part 2A of the row decoder 2 that is connected to one of the word lines WL, the circuit 2A includes MOS transistors T23–T25 connected in series between the power supply terminal Vcc and the ground, wherein the transistor T23 is a p-channel MOS transistor and is enabled in response to a control signal $\phi R$ that is supplied from the clock generator 10 of FIG. 1. The transistors T24 and T25 are formed of an n-channel MOS transistor and is supplied with a selection signal for selecting the word line WL from the address decoder 3. It should be noted that a number of circuits shown in FIG. 8 are provided in the word line decoder 2 in correspondence to each word line WL.

In response to the selection signal, the voltage level at a node N24 is changed, and the voltage change at the node N24 is transferred on the one hand to an n-channel MOS transistor T20 via an inverter INV1 and a transistor T22 that is activated in response to a control signal $\phi V$ from the clock generator 10, and on the other hand to another n-channel MOS transistor T21 connected in series to the transistor T20 via a second inverter INV2. To the drain of the transistor T21, the word line voltage produced by the word line driver WDD is supplied, while the source of the transistor T21 is connected to the ground. The word line WL is connected to the source of the transistor T20. The word line driver WDD may have a conventional construction and includes a boost circuit. On the other hand, the word line driver WDD does not include a clamp circuit.

In the circuit of FIG. 8, there is provided a clamp circuit 32 at the gate of the transistor T20. Referring to FIG. 8, the clamp circuit 32 includes transistors T26 and T27 connected in series between the gate of the transistor T20 and the power supply terminal Vcc, wherein each transistor has its gate connected to its drain.

When the word line voltage is supplied to the drain of the transistor T20 from the word line driver WDD and subsequently boosted, the voltage level of the source of the transistor T20 is boosted in correspondence thereto. Thus, when the word line voltage on the word line WL is boosted to the level of Vcc+Vth, the gate voltage of the transistor T20 is boosted to the level Vcc+2Vth because of the effect of the capacitance at the gate of the transistor T20. Here, Vth represents the threshold voltage of the transistor T20. Further, it should be noted that the transistor T22 is disabled by the control signal $\phi V$ when the boosting is started.

Now, when the voltage level at the word line WL has exceeded the level Vcc+Vth, the clamp circuit 32 starts to remove the electric charges on the gate of the transistor T20 to the power supply terminal Vcc, and the gate voltage of the transistor T20 is clamped at the level Vcc+2Vth. It should be noted that the transistors T26 and T27 both have the threshold voltage Vth. In response thereto, it should be noted that the word line voltage at the drain of the word line WL is clamped at the level of Vcc+Vth. In this construction, too, one can eliminate the voltage overshoot of the word line voltage effectively and efficiently, as the clamp circuit is connected to the gate of the transistor T20 rather than the word line itself.

Figure 9:
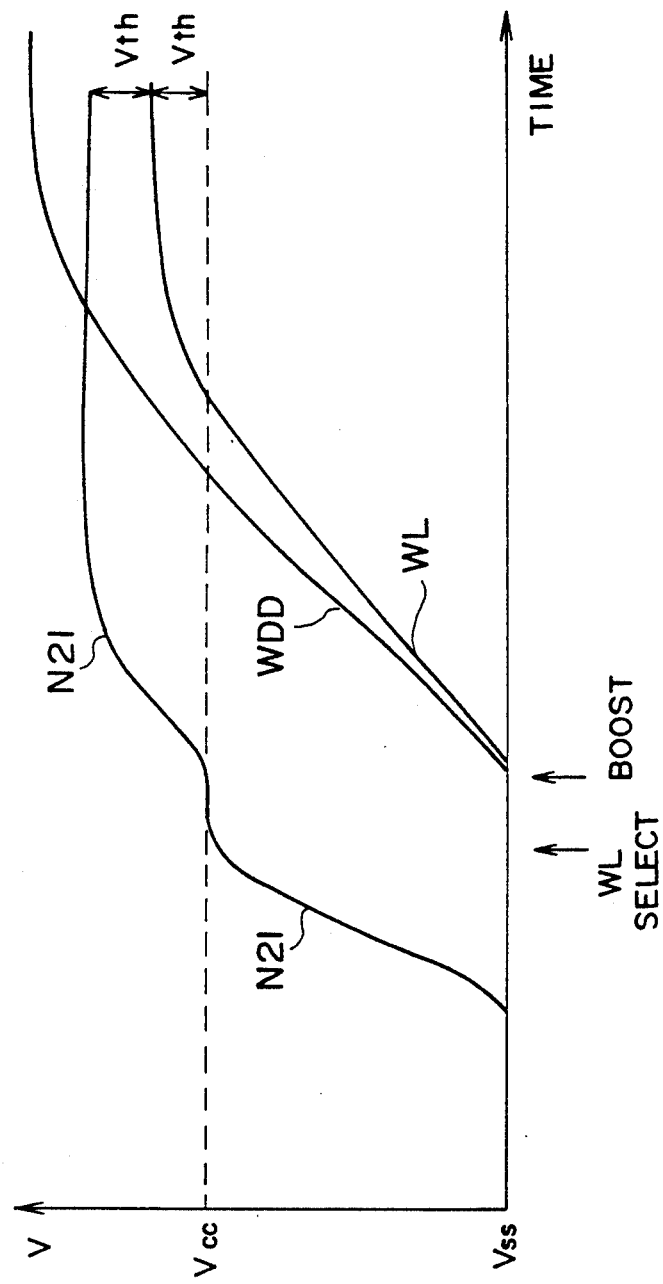
FIG. 9 is a diagram showing the operation of the circuit of FIG. 8.

FIG. 9 shows the operation of the circuit of FIG. 8.

In response to the access of the circuit 2A of the row decoder 2, the voltage level of the node N21 connected to the gate of the transistor T20 is increased from the level Vss to the level Vcc. In response to the rising of the voltage at the node N21, the voltage at the node N22 connected to the gate of the transistor T21 decreases to the level Vss. Thereby, the transistor T20 is turned on while the transistor T21 is turned off, and the selection of the word line WL is achieved.

Next, the voltage level at the source of the transistor T20 is raised and the boosting of the word line is started. In response to the increase in the output voltage of the word line driver WDD, the voltage level at the node N21 is boosted as already described to the level Vcc+2Vth, where the voltage is clamped by the clamp circuit 32, even when the output of the word line drive WDD has increased beyond the level Vcc +Vth, as illustrated in FIG. 9. As a result of the clamping of the voltage level of the gate of the transistor T01, the word line voltage on the word line WL is clamped at the level Vcc+Vth as already described.

In this embodiment, no separate capacitance element such as the transistor T11 of the first embodiment is used for boosting the gate voltage of the transistor T20. However, the principle of the boosting is substantially the same as in the first embodiment, as the capacitance at the gate of the transistor T20 acts as the capacitance provided by the transistor T11 of the first embodiment.

Figure 10:
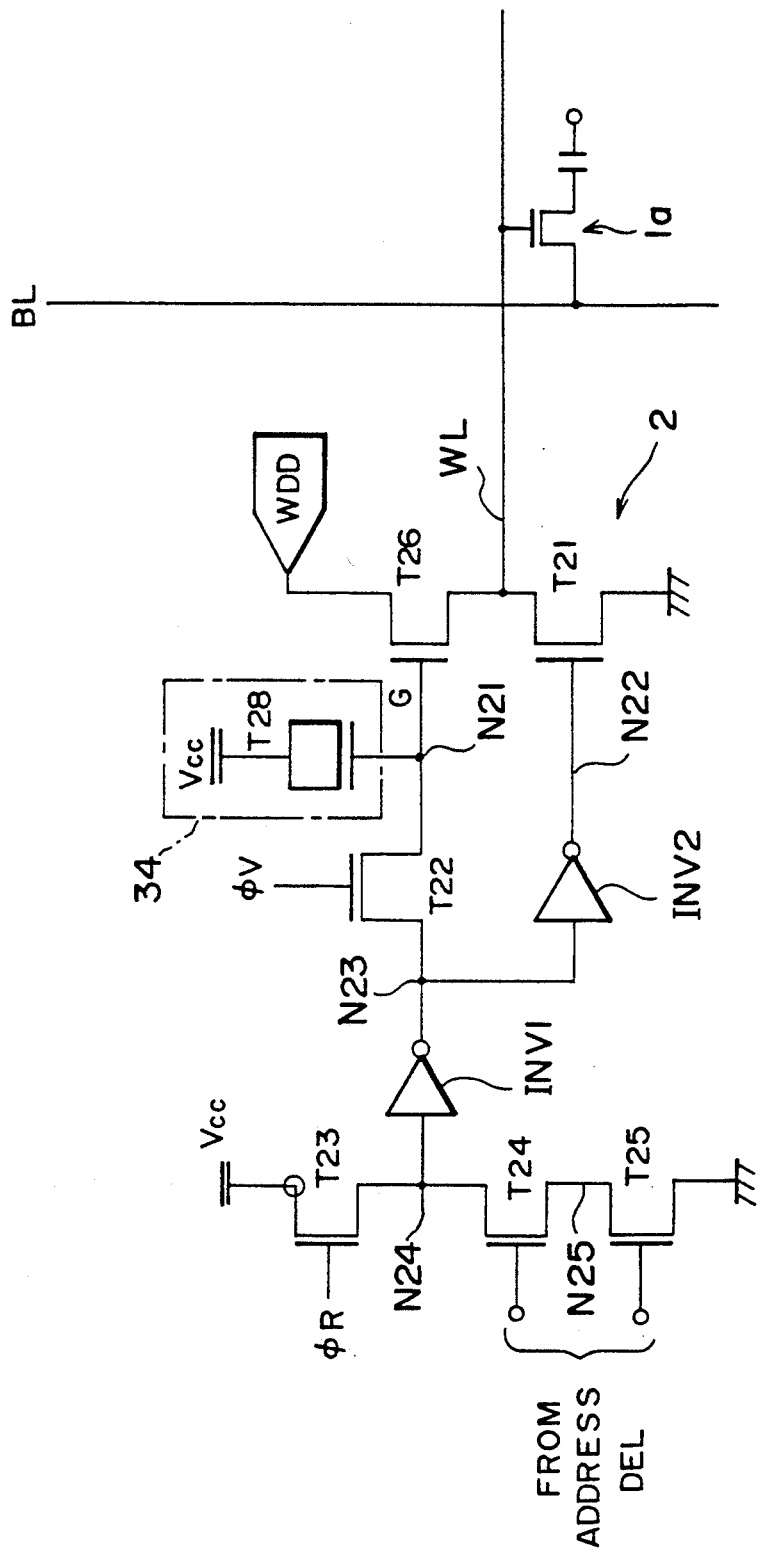
FIG. 10 is a circuit diagram showing a third embodiment of the present invention.

Next, a third embodiment of the present invention will be described with reference to FIG. 10. In FIG. 10, the parts that correspond to those described previously are designated by the same reference numerals and the description thereof will be omitted.

The circuit of FIG. 10 corresponds to the circuit of FIG. 8, except that a MOS transistor T28 connected to form a capacitor is used in the clamp circuit now designated by the numeral 34. By suitably choosing the size such as the thickness and area of the gate oxide film of the MOS transistor T28, one can clamp the voltage level of the node N21 at the level of Vcc+2Vth and the word line voltage at the level of Vcc+Vth. The construction of the clamp circuit 34 is of course applicable to the first embodiment, in place of the clamp circuit 26.

Further, the clamping level of the word line is not limited the level of Vcc+Vth described heretofore, but to any higher level such as Vcc+2Vth, Vcc+3Vth, . . ., as long as the memory cell transistor can endure the word line voltage. One can achieve this by simply increasing the number of stages of the transistors in the clamp circuit 26 or clamp circuit 32.

Further, the present invention is not limited to the embodiments described heretofore, but various variations and modifications may be made without departing from the scope of the invention.

What is claimed is:

1. A semiconductor memory device including an array of memory cell transistors connected to a plurality of word lines and bit lines, comprising:
   a node to which a voltage boosted above a supply voltage is supplied;
   first means for producing a first voltage that is larger than said supply voltage;
   a MOS transistor connected between said first means and said node for selectively transferring electric charges from said first means to said node, said MOS transistor producing said voltage boosted above said supply voltage at said node;
   second means for supplying a second voltage larger than said supply voltage to a gate of said MOS transistor; and
   means for preventing said second voltage from rising above a predetermined voltage.

2. A semiconductor memory device including an array of memory cell transistors connected to a plurality of word lines and bit lines, comprising:
   a node to which a voltage boosted above a supply voltage is supplied;
   first means for producing a first voltage that is larger than said supply voltage;
   a MOS transistor connected between said first means and said node for selectively transferring electric charges from said first means to said node, said MOS transistor producing said voltage boosted above said supply voltage at said node;
   second means for supplying a second voltage larger than said supply voltage to a gate of said MOS transistor;
   means for preventing said second voltage from rising above a predetermined voltage; and
   a word decoder for supplying a selection signal to a word line;
   said first voltage at said node being supplied as a drive signal of said word decoder.

3. A semiconductor memory device including an array of memory cell transistors connected to a plurality of word lines and bit lines and a word decoder for selecting one of said plurality of word lines, comprising:
   a node to which a voltage boosted above a supply voltage is supplied;
   first means for producing a first voltage that is larger than said supply voltage;
   a MOS transistor connected between said first means and said node for selectively transferring electric charges from said first means to said node, said MOS transistor producing said voltage boosted above said supply voltage at said node;
   second means for supplying a second voltage larger than said supply voltage to a gate of said MOS transistor; and
   means for preventing said second voltage from rising above a predetermined voltage;
   said word decoder including said MOS transistor and said second means in correspondence to each of said word lines such that said node is connected to a corresponding word line;
   said second means of producing said second voltage selectively in response to an address signal supplied to said word decoder.

4. A semiconductor memory device, comprising:
   a memory cell array including a plurality of memory cells for storing data, a plurality of word lines connected to the memory cells, and a plurality of bit lines connected to the memory cells;
   word line selection means connected to each of the word lines and supplied with first address data specifying one of the word lines to which a selected memory cell is connected, for selecting the specified word line;
   bit line selection means connected to each of the bit lines and supplied with second address data specifying one of the bit lines to which said selected memory cell is connected, for selecting the specified bit line;
   input/output means connected to the bit line selection means for supplying data to be written into the selected memory cell to the selected bit line, and for reading data from the selected memory cell via the selected bit line;
   word line drive means comprising a MOS transistor having a gate, a drain and a source, said source being connected to the word line selection means, said MOS transistor being supplied with an activation signal at the gate and producing a word line voltage at the source such that the word line voltage is supplied to the selected word line via the word line selection means;
   word line boosting means connected to the drain of the MOS transistor for boosting the word line voltage via said MOS transistor, said word line boosting means including a boosting capacitor having a first end connected to the source of said MOS transistor and a second end connected to the gate of said MOS transistor for boosting a voltage level at the gate of the MOS transistor above said supply voltage in correspondence to the boosting of the word line voltage; and clamping means connected to the gate of said MOS transistor for clamping the voltage level of the gate of the MOS transistor at a predetermined level.

5. A semiconductor memory device as claimed in claim 4 in which said clamping means comprises a plurality of MOS transistors connected in series between the gate of the MOS transistor of the word line drive means and the supply voltage, each of said MOS transistors of said clamping means having a gate and a drain connected with each other.

6. A semiconductor memory device as claimed in claim 4 in which said clamping means comprises a MOS capacitor connected between the gate of the MOS transistor of the word line drive means and the supply voltage.

7. A semiconductor memory device as claimed in claim 4 in which said boosting capacitor comprises a capacitance formed between the gate and the drain of the MOS transistor of the word line boosting means.

8. A semiconductor memory device as claimed in claim 4 in which said boosting means further comprises a second boosting capacitor having an end connected to the drain of the MOS transistor and a second end supplied with a boosting signal for boosting a voltage level of the drain of the MOS transistor above the supply voltage in response to the boosting signal.

9. A semiconductor memory device as claimed in claim 4 further comprising a precharge circuit connected to the drain of the MOS transistor of the word line drive means for supplying the supply voltage thereto.

10. A semiconductor memory device as claimed in claim 4 further comprising a drive circuit connected to the gate of the MOS transistor of the word line drive means for activating the same when supplying the word line voltage to the selected word line, said drive circuit releasing said gate of the MOS transistor of the word line drive means to a floating state when the boosting of the word line is started by the boosting means.

11. A semiconductor memory device, comprising:

a memory cell array including a plurality of memory cells for storing data, a plurality of word lines connected to the memory cells, and a plurality of bit lines connected to the memory cells;

word line selection means connected to each of the word lines and supplied with first address data specifying one of the word lines to which a selected memory cell is connected, for selecting the specified word line;

bit line selection means connected to each of the bit lines and supplied with second address data specifying one of the bit lines to which said selected memory cell is connected, for selecting the specified bit line;

input/output means connected to the bit line selection means for supplying data to be written into the selected memory cell to the selected bit line, and for reading data from the selected memory cell via the selected bit line;

word line drive means for supplying a word line voltage to the selected word line via the word line selection means;

word line boosting means connected to the word line drive means for boosting the word line voltage;

said word line selection means comprising a plurality of MOS transistors provided in correspondence to the plurality of word lines, each of said MOS transistors having a gate, a drain connected to the word line drive means for receiving the word line voltage, and a source connected to the word line corresponding to the MOS transistor, said MOS transistor having a capacitance between the gate and the source; and clamping means provided in correspondence to each of said plurality of MOS transistors electrically connected to the gate of said MOS transistor for clamping a voltage level of said gate at a predetermined level.

12. A semiconductor device comprising:

a node to which a voltage boosted above a supply voltage is supplied;

first means for producing a first voltage that is larger than said supply voltage;

a MOS transistor connected between said first means and said node for selectively transferring electric charges from said first means to said node, said MOS transistor producing said voltage boosted above said supply voltage at said node;

second means for supplying a second voltage larger than said supply voltage to a gate of said MOS transistor; and means for preventing said second voltage from rising above a predetermined voltage.

* * * * *

UNITED STATES PATENT AND TRADEMARK OFFICE
CERTIFICATE OF CORRECTION

PATENT NO. : 5,253,204
DATED : October 12, 1993
INVENTOR(S) : Atsushi HATAKEYAMA et al.

It is certified that error appears in the above-indentified patent and that said Letters Patent is hereby corrected as shown below:

On the title page, item [73], "Hatakeyama et al." should be --Fujitsu Limited--.

Signed and Sealed this

Fourth Day of October, 1994

*Attest:*

BRUCE LEHMAN

*Attesting Officer*   *Commissioner of Patents and Trademarks*